United States Patent [19]

Godsey

[11] 4,364,618

[45] Dec. 21, 1982

[54] ELECTRONIC DEVICE PACKAGE

[75] Inventor: Ernest E. Godsey, Tucson, Ariz.

[73] Assignee: Burr-Brown Research Corp., Tucson, Ariz.

[21] Appl. No.: 150,740

[22] Filed: May 19, 1980

[51] Int. Cl.³ .............................................. H01R 9/09
[52] U.S. Cl. .......................... 339/17 LC; 339/DIG. 3
[58] Field of Search .................. 235/10; 200/275, 278;
 361/412; 339/17 L, 17 LC, 17 LM, 17 MR, 176
 MP, DIG. 3; 206/305, 334

[56] References Cited

U.S. PATENT DOCUMENTS

| | | | |
|---|---|---|---|
| 3,680,037 | 7/1972 | Nellis et al. | 339/DIG. 3 |
| 3,887,791 | 6/1975 | Kitchens | 235/1 D |
| 3,997,226 | 12/1976 | Lang et al. | 339/17 LM |
| 4,121,135 | 10/1978 | Hunt et al. | 339/17 M |
| 4,225,257 | 9/1980 | Andreaggi | 235/1 D |
| 4,254,309 | 3/1981 | Johnson | 200/275 |

FOREIGN PATENT DOCUMENTS

| | | | |
|---|---|---|---|
| 52-73395 | 6/1977 | Japan | 339/DIG. 3 |
| 544028 | 1/1977 | U.S.S.R. | 339/DIG.3 |

Primary Examiner—Eugene F. Desmond
Attorney, Agent, or Firm—Harry M. Weiss

[57] ABSTRACT

This disclosure relates to an improved apparatus for and method of packaging an electronic device which has at least two electrically operative components which may be printed circuit boards, and a case to space the electrically operative components so that their respective functional surfaces can be positioned in a predetermined relationship, such as to establish a flush surface to allow the application of a single adhesive backed overlay to seal the multiple functional surfaces against entry of foreign matter. The case also serves as a means to gird an elastomeric connecting element which is compressed by the electrically operative components to electrically connect those components.

3 Claims, 8 Drawing Figures

ELECTRONIC DEVICE PACKAGE

BACKGROUND OF THE INVENTION

1. Field of the Invention

This invention relates generally to packages and, more specifically, to packages useful for functionally coupling electronic components into a single electronic device.

2. Description of the Prior Art

In the past, electronic devices such as hand-held computers have been fabricated by methods incorporating a variety of hardware. One approach to packaging such devices was to mount all of the necessary electronic, manual input and sensory output devices on a single circuit board. Typical of such devices was a hand-held computer utilizing: a single printed circuit board mounting a display device having a display surface at an elevation from the printed circuit board; a matrix of key switches mounted on or very near the elevation of the printed circuit board; a case, mounting the printed circuit board, having an essentially flush surface at the elevation of the display surface; and a plurality of key caps to allow the actuation of the key switches from the flush surface. In addition to requiring additional passive parts in the form of key caps, such a method of construction presented a problem when attempting to seal the surface of the calculator against entry of foreign matter, particularly at those portions near the key caps.

An alternate method of constructing such hand-held calculator devices involved the use of a single printed circuit board mounting a display device having a display surface at a different elevation than the printed circuit board, a matrix of domed type key switches mounted proximal to the surface of the printed circuit board and sealed by an adhesive backed overlay, as illustrated by U.S. Pat. Nos. 4,042,439 and 4,085,306. Such a method of construction, however, left the surface of the keyboard surface at a different elevation than the display surface and thereby prevented the utilization of a single adhesive backed overlay to seal both the display surface framed by the display window in the case and the keyboard assembly.

An even further approach to manufacture of such a hand-held calculator device was to mount the display apparatus, and correspondingly the display surface, at a canted angle with respect to the plane of the keyboard surface and thereby provide improved visibility of the display surface to the operator. Such a method of construction, however, was accompanied by the corresponding cost problems associated with hard wiring the circuit boards to the display apparatus to provide an electrical connection.

A need existed for an electronic device package which would allow an operative electronic device having at least two printed circuit boards, each having a functional surface at a different elevation from the respective mounting surface of the printed circuit board, to be mounted to provide a single flush surface.

SUMMARY OF THE INVENTION

Figure 1:
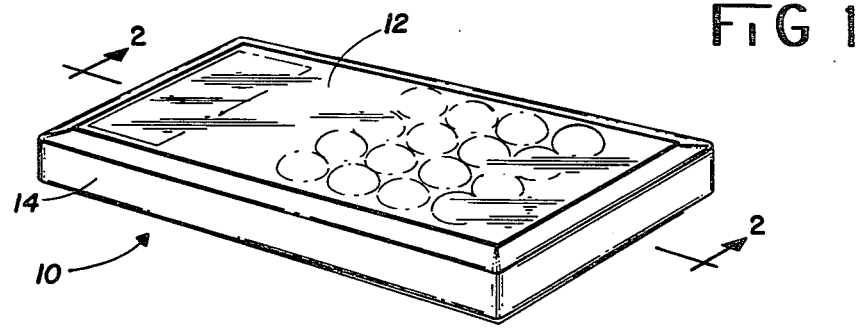
FIG. 1 is a perspective view of an electronic device having an essentially flush operating and viewing surface.

In accordance with one embodiment of this invention, it is an object to provide an improved package for an electronic device.

In accordance with another embodiment of this invention, it is an object to provide an improved package for an electronic device so that more than one functional surface, each having a different elevation with respect to the mounting surface of a respective supporting circuit board, can be mounted on a common surface.

It is a further object of this invention to provide an improved package for an electronic device that allows more than one operative surface, each supported by a separate printed circuit board, to be mounted on an essentially flush surface in at least two planes without requiring the printed circuit boards to be hard wired together.

DESCRIPTION OF THE PREFERRED EMBODIMENTS

In accordance with one embodiment of this invention, an improved package for an electronic device is disclosed, comprising: a substantially flush operating and viewing surface; at least first and second circuit boards located below the flush surface, each provided with a mounting surface and a functional surface respectively having a difference of elevations between the mounting surface and the functional surface; and insulation separation means located between the first and second circuit boards for cooperatively coupling the circuit boards together so that the functional surfaces are coincidental with the flush operating and viewing surface.

In accordance with another embodiment of this invention, an improved package for an electronic device is disclosed, comprising: an operating and viewing surface having at least first and second planes; at least first and second circuit boards mounted below the operating and viewing surface, each respectively provided with a functional surface, a mounting surface, and an elevation between the mounting surface and the functional surface; and insulation separation means located between the first and second circuit boards for cooperatively coupling the circuit boards so that the first functional surface is coincidental with the first plane and the second functional surface is coincidental with the second plane.

In accordance with yet another embodiment of this invention, an improved method for assembling an electronic device having an essentially flush operating and viewing surface and at least first and second circuit boards located below the flush surface, each provided with a mounting surface and a functional surface and respectively having a difference of elevations between the mounting surface and the functional surface is disclosed, comprising the step of spacing the circuit boards with the case so that the functional surfaces are substantially coincidental with the operating surface.

The foregoing and other objects, features, and advantages will be apparent from the following, more particular, description of the preferred embodiments of the invention, as illustrated in the accompanying drawings.

DESCRIPTION OF THE SPECIFICATION

Referring to FIG. 1, an electronic device having a package incorporating the disclosed invention is shown generally at reference number 10. The electronic device 10 is provided with a substantially flush operating and viewing surface 12, and a case 14, co-operatively coupled to the flush surface 12.

Figure 2:
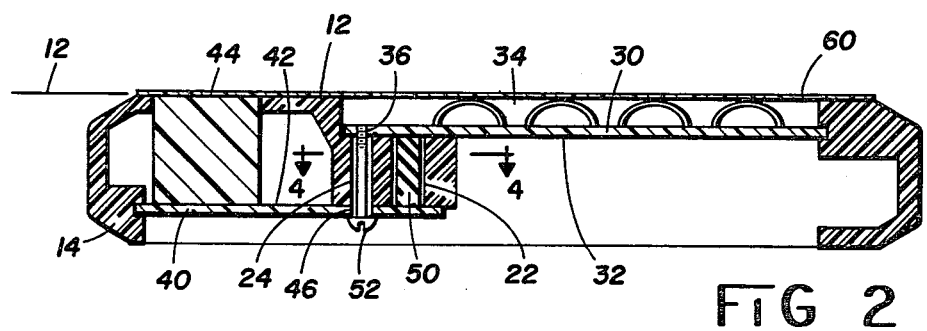
FIG. 2 is a sectional view of an electronic device provided with a package incorporating the disclosed invention, taken along line 2—2 of FIG. 1.

Referring to FIG. 2, a sectional view referenced from line 2—2 of FIG. 1 is shown. At least a first circuit board 30 and a second circuit board 40 are mounted below the flush surface 12. The first circuit board 30 is provided with a mounting surface 32 and a functional surface 34 having a first elevation between the mounting surface 32 and the functional surface 34. The second circuit board 40 is provided with a mounting surface 42, and a functional surface 44 having a second elevation between the mounting surface 42 and the functional surface 44, there being a difference between the first elevation and the second elevation.

The case 14 can be seen spacing the first circuit board 30 and the second circuit board 40 so that the first functional surface 34 and the second functional surface 44 are substantially coincidental with the flush surface 12. The flush surface 12 lies generally above the case 14 which, referring also to FIG. 3, defines a first case surface 16 for communicating with the first circuit board 30, and a second case surface 18 for communicating with the second circuit board 40. The case 14 further defines a connector aperture 22 whose respective termini fall within and are defined by the first case surface 16 and the second case surface 18. The case 14 also defines a case fastener aperture 24 whose respective termini are defined by the first case surface 16 and the second case surface 18. Fastener means for compressing conductor means for electrically connecting the first circuit board 30 and the second circuit board 40 are comprised of at least a first lug 26 integrally formed in the case 14 and arranged to engage an end of the first circuit board 30, and at least a second lug 28 also integrally formed in the case 14 and arranged to engage an end of the second circuit board 40.

The first circuit board 30 is further provided with a first circuit board connector aperture 36 arranged to receive a threaded fastener 52 at a point distal to the first lug 26. The second circuit board 40 is provided with a second circuit board fastener aperture 46 arranged to receive the fastener 52 at a point distal to the second lug 28. The first circuit board 30 and the second circuit board 40 are in contact with conductor means, as for example an elastomeric connector 50, for electrically connecting the first circuit board 30 to the second circuit board 40. The elastomeric connector 50 preferably has a height greater than the depth of the connector aperture 22 which is equal to the difference in elevations between the first case surface 16 and the second case surface 18. The elastomeric connector 50 lies within the girth of the connector aperture 22, thereby mounting the connector 50 in the case 12, and is retained by fastener means further comprised of, as for example, the threaded fastener 52 through the second circuit board fastener aperture 46, the case fastener aperture 24, and the first circuit board fastener aperture 36 so that the first circuit board mounting surface 32 and the second circuit board mounting surface 42 compress the elastomeric connector 50 within the girth of the connector aperture 22 so that electrical contact is established. As shown, installation of the fastener means, comprised of the single threaded fastener 52, produces a rigid coupling of the case 14, the first circuit board 30, and the second circuit board 40, and further, in conjunction with the elastomeric connector 50, produces the electrical connection between the first circuit board 30 and the second circuit board 40.

The improved package for an electronic device 10 is preferably provided with a continuous adhesive backed overlay 60. Referring to FIG. 2, the overlay 60 is shown attached to the flush surface 12 and the case 14 so that the operating and viewing surface 12 is sealed against entry of foreign matter. Coincidentally, the overlay 60 may also cooperatively couple snap switch assemblies to the first circuit board 30, as disclosed in U.S. Pat. No. 4,042,439.

Figure 3:
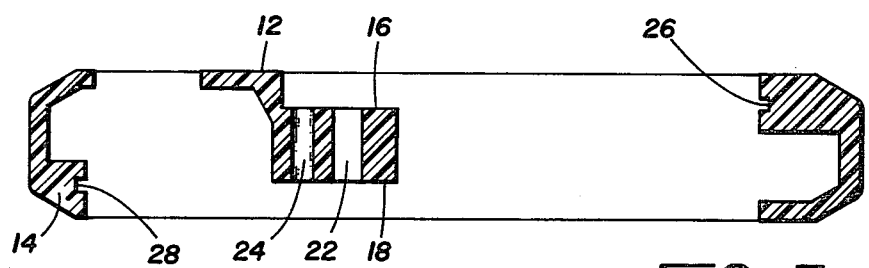
FIG. 3 is a sectional view of an electronic device having a package utilizing the disclosed invention taken along line 2—2 of FIG. 1 with the operative electronic components removed for clarity.

Referring to FIG. 3, a section of a bare case 14 for an electronic device 10, with other components omitted for clarity, taken along the same reference line as FIG. 2 is shown. FIG. 3 more clearly shows the first case surface 16, the second case surface 18 spaced from the first case surface 16, the essentially flush surface 12, the connector aperture 22 having termini on the first case surface 16 and the second case surface 18, the case fastener aperture 24 having termini on the first case surface 16 and the second case surface 18, and the mounting lugs 26 and 28 for respectively engaging the first circuit board 30 and the second circuit board 40.

Figure 4:
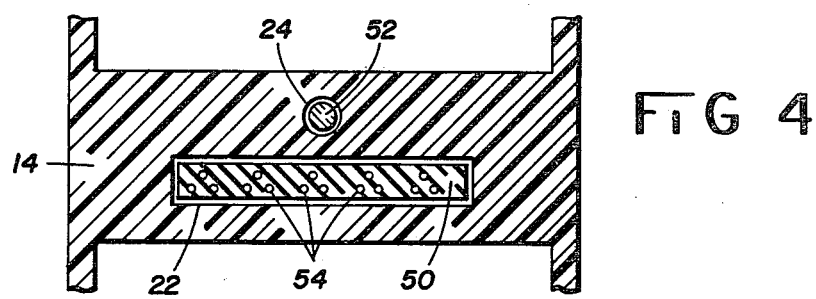
FIG. 4 is a sectional view taken along line 4—4 of FIG. 2.

Referring to FIG. 4, a section taken along line 4—4 of FIG. 2 is shown. The case body 14 is shown defining the connector aperture 22, which connector aperture 22 encloses and girds the elastomeric connecting element 50. The elastomeric connecting element is provided with a plurality of electrically isolated individual conductors 54. The case body 14 further defines the case connector aperture 24 shown enclosing the threaded fastener 52.

Figure 5:
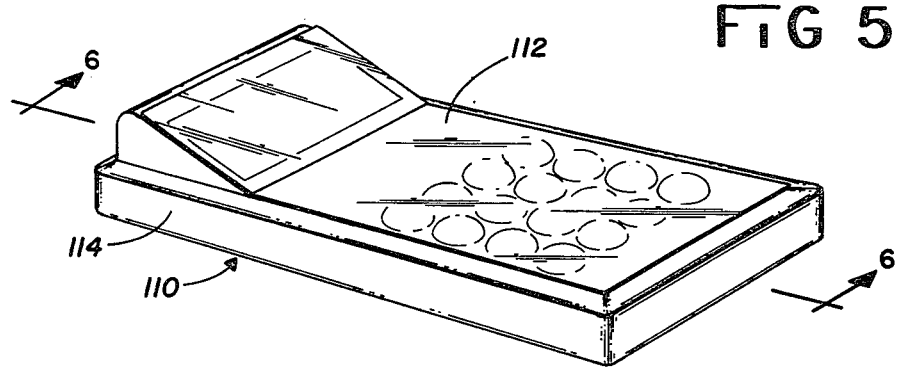
FIG. 5 is a perspective view of an electronic device having an essentially flush operating and viewing surface lying in two planes.

Referring to FIG. 5, an electronic device, having a package incorporating an alternate embodiment of the disclosed invention, is shown generally at reference number 110. The electronic device 110 is provided with a substantially flush operating and viewing surface 112 having (refer to FIG. 6) at least a first plane 112A and a second plane 112B, and a case 114, co-operatively coupled to the flush surface 112.

Figure 6:
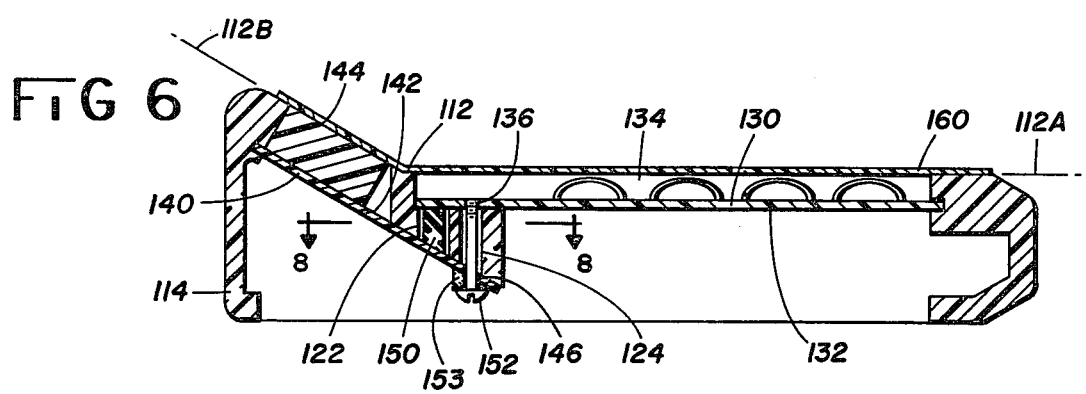
FIG. 6 is a sectional view of an electronic device having an essentially flush operating and viewing surface lying in two planes and having a package incorporating the disclosed invention, taken along lines 6—6 of FIG. 5.

Referring to FIG. 6, a sectional view referenced from line 6—6 of FIG. 5 of an electronic device 110 having a package incorporating the alternate embodiment of the disclosed invention is shown. The flush surface 112A is anterior to circuit board 130 which has a first functional surface 134 lying in the plane 112A, and the flush surface 112B is anterior to second circuit board 140 which has a second functional surface 144 lying in the plane 112B. The first circuit board 130 is provided with a mounting surface 132 and the functional surface 134, having a first elevation between the mounting surface 132 and the functional surface 134. The second circuit board 140 is provided with a mounting surface 142, and the functional surface 144 having a second elevation between the mounting surface 142 and the functional surface 144, there possibly being a difference between the first elevation and the second elevation.

Figure 7:
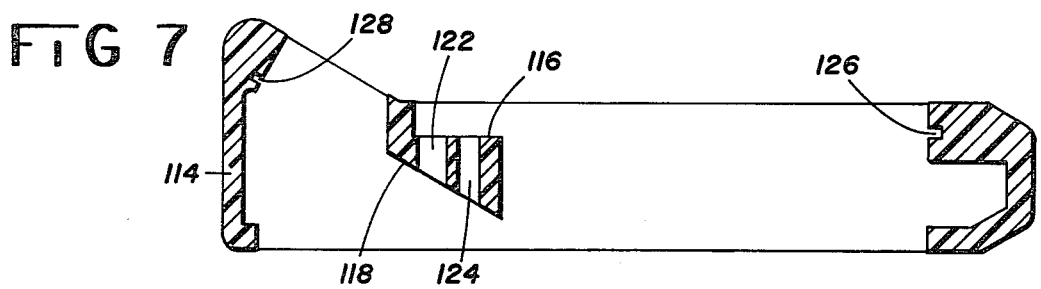
FIG. 7 is a sectional view similar to FIG. 6 with the operative electronic components deleted to more clearly illustrate the device package.

The flush surface 112 lies generally above the case 114, and, referring also to FIG. 7, defines a first case surface 116 lying parallel to the first plane 112A for communicating with the mounting surface of the second circuit board 140. The case 114 further defines a connector aperture 122 whose respective termini fall within and are defined by the first case surface 116 and the second case surface 118. The case 114 also defines a case fastener aperture 124 whose respective termini are defined by the first case surface 116 and the second case surface 118. Fastener means for compressing conductor means for electrically connecting the first circuit board 130 and the second circuit board 140 are comprised of at least a first lug 126 integrally formed in the case 114 arranged to engage an end of the first circuit board 130, and at least a second lug 128 also integrally formed in the case 114 arranged to engage an end of the second circuit board 140.

The first circuit board 130 is further provided with a first circuit board connector aperture 136 arranged to receive a threaded fastener 152 at a point distal to the first lug 126. The second circuit board 140 is provided with a second circuit board fastener aperture 146 arranged to receive the fastener 152 at a point distal to the second lug 28. The first circuit board 130 and the second circuit board 140 are in contact with conductor means, as for example, an elastomeric connector 150, for electrically connecting the first circuit board 130 to the second circuit board 140. The elastomeric connector 150 is provided with a first end parallel to the plane 112A and a second end parallel to the plane 112B and preferably has a mean height greater than the depth of the connector aperture 122, which is equal to the mean difference in elevations as defined by the first case surface 116 and the second case surface 118. The elastomeric connector 150 lies within the girth of the connector aperture 122 and is retained by fastener means, further comprised of, as for example, the threaded fastener 152 passing through the second circuit board fastener aperture 146, the case fastener aperture 124 and the first circuit board fastener aperture 136 so that the first circuit board mounting surface 132 and the second circuit board mounting surface 142 compress the elastomeric connector 150. As shown, installation of the fastener means further comprised of the single threaded fastener 152 engaging a bevel washer 153 having a washer fastener aperture defined by a first end lying parallel to plane 112A and a second end lying parallel to plane 112B, and a nut produces a rigid coupling of the case 114, the first circuit board 130, and the second circuit board 140, and further, in conjunction with the elastomeric connector 150, produces an electrical connection between the first circuit board 130 and the second circuit board 140.

The improved package for an electronic device 110 is preferably provided with a continuous adhesive backed overlay 160 provided with a first plane parallel to the plane 112A and the second plane parallel to the second plane 112B. Referring to FIG. 6, the overlay 160 is shown attached to the flush surface 112 and the case 114 so that the operating and viewing surface 112 is sealed against entry of foreign matter. Coincidentally, the overlay 160 may also cooperatively couple snap switch assemblies to the first circuit board 130, as disclosed in U.S. Pat. No. 4,042,439, issued to W. R. Pounds.

Referring to FIG. 7, a section of a bare case 114 for an electronic device 10, with other components omitted for clarity, taken along the same reference line as FIG. 6, is shown. FIG. 7 more clearly shows the first case surface 116, the second case surface 118 spaced from the first case surface 116, the essentially flush surface 112 having the first and second planes 112A and 112B, the connector aperture 112 having termini on the first case surface 116 and the second case surface 118, the case fastener aperture 124 having termini on the first case surface 116 and the second case surface 118, and the mounting lugs 126 and 128 for respectively engaging the first circuit board 130 and the second circuit board 140.

Figure 8:
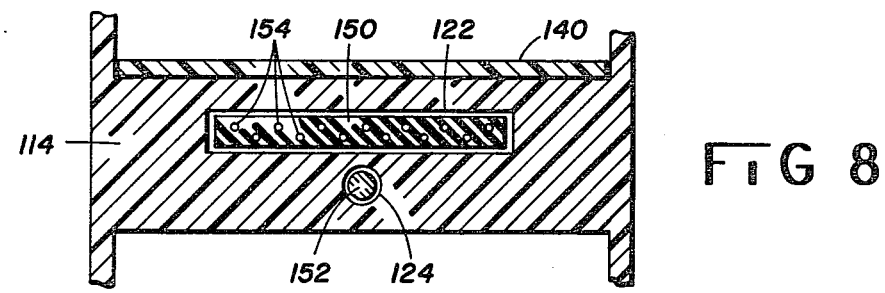
FIG. 8 is a sectional view taken along line 8—8 of FIG. 6.

Referring to FIG. 8, a section taken along line 8—8 of FIG. 6 is shown. The case body 114 is shown defining the connector aperture 122, which connector aperture 122 encloses the elastomeric connecting element 150. The elastomeric connecting element is provided with a plurality of electrically isolated individual conductors 154. The case body 114 further defines the case connector aperture 124 shown enclosing the threaded fastener 152.

While the invention has been particularly shown and described with reference to preferred embodiments thereof, it will be understood by those skilled in the art that the foregoing and other changes in form and details may be made therein without departing from the spirit and scope of the invention.

What is claimed:

1. A package for operatively coupling at least two circuit boards in an electronic package, comprising:
   a case defining an operating and viewing surface;
   said case further defining an aperture having terminii respectively adjoining each of said circuit boards;
   connector means having an elastomeric connector provided with conductors for electrically connecting said circuit boards; and
   fastener means for compressing said elastomeric connector within said aperture and between said circuit boards so that a mechanical connection is effected among said circuit boards and said case and an electrical connection is effected between said circuit boards.

2. A package for operatively coupling at least two circuit boards in an electronic device, comprising:
   case means having a case for defining an operating surface;
   said case further defining an aperture having terminii respectively adjoining each of said circuit boards;
   connector means having an elastomeric connector provided with conductors for electrically connecting said circuit boards; and
   fastener means for compressing said elastomeric connector within said aperture and between said circuit boards so that a mechanical connection is effected among said circuit boards and said case and an electrical connection is effected between said circuit boards.

3. A method for operatively coupling at least two circuit boards in an electronic device, comprising the steps of:
   providing a case defining an operating surface;

defining in said case an aperture having terminii respectively adjoining each of said circuit boards;
placing in said aperture an elastomeric connector having conductors for electrically conducting; and
compressing said elastomeric connector within said aperture and between said circuit boards so that a mechanical connection is effected among said circuit boards and said case and an electrical connection is effected between said circuit boards.

* * * * *